(12) United States Patent
Hsieh

(10) Patent No.: US 11,817,433 B2
(45) Date of Patent: *Nov. 14, 2023

(54) LIGHT-EMITTING DEVICE

(71) Applicant: EPISTAR CORPORATION, Hsinchu (TW)

(72) Inventor: Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/515,349

(22) Filed: Oct. 29, 2021

(65) Prior Publication Data

US 2022/0059512 A1 Feb. 24, 2022

Related U.S. Application Data

(63) Continuation of application No. 16/595,804, filed on Oct. 8, 2019, now Pat. No. 11,189,602.

(30) Foreign Application Priority Data

Oct. 8, 2018 (TW) .................................. 107135433

(51) Int. Cl.
| | |
|---|---|
| *H01L 25/075* | (2006.01) |
| *H01L 33/60* | (2010.01) |
| *H01L 33/62* | (2010.01) |
| *H01L 21/20* | (2006.01) |
| *H01L 25/16* | (2023.01) |
| *H01L 33/48* | (2010.01) |

(52) U.S. Cl.
CPC .......... *H01L 25/0753* (2013.01); *H01L 33/60* (2013.01); *H01L 33/62* (2013.01); *H01L 2933/0066* (2013.01)

(58) Field of Classification Search
CPC ..... H01L 25/0753; H01L 33/60; H01L 33/62; H01L 2933/0066; H01L 25/0756; H01L 33/20; H01L 25/167; H01L 33/48; H01L 33/24; H01L 33/32; G09G 3/32
See application file for complete search history.

(56) References Cited

U.S. PATENT DOCUMENTS 5,703,436 A * 12/1997 Forrest ..................... G09F 9/335
257/E33.056
11,189,602 B2 * 11/2021 Hsieh ...................... H01L 33/62
(Continued)

FOREIGN PATENT DOCUMENTS

| KR | 20130068389 A | 6/2013 |
| KR | 101590468 B1 | 2/2016 |

*Primary Examiner* — Herve-Louis Y Assouman
(74) *Attorney, Agent, or Firm* — Patterson + Sheridan, LLP

(57) ABSTRACT

An embodiment of present invention discloses a light-emitting device which includes a first light-emitting area, a second light-emitting area, and a third light-emitting area. The first light-emitting area emits a red light and includes a first light-emitting unit. The second light-emitting area emits a blue light and includes a second light-emitting unit. The third light-emitting area emits a green light and includes a third light-emitting unit. The first light-emitting area is larger than the second light-emitting area and larger than the third light-emitting area. Each of the first light-emitting unit, the second light-emitting unit, and the third light-emitting unit has a width of less than 100 μm and a length of less than 100 μm.

20 Claims, 9 Drawing Sheets

(56) References Cited

U.S. PATENT DOCUMENTS

| | | |
|---|---|---|
| 2005/0155706 A1 | 7/2005 | Nishida et al. |
| 2006/0163589 A1* | 7/2006 | Fan ...................... H01L 27/153 |
| | | 257/E25.02 |
| 2007/0069220 A1 | 3/2007 | Ogihara |
| 2007/0210325 A1 | 9/2007 | Park et al. |
| 2010/0117936 A1 | 5/2010 | Lhee et al. |
| 2012/0056531 A1* | 3/2012 | Park ..................... H10K 50/125 |
| | | 313/506 |
| 2012/0206326 A1 | 8/2012 | Nakamura et al. |
| 2013/0341656 A1 | 12/2013 | Chan et al. |
| 2014/0048825 A1 | 2/2014 | Hsieh et al. |
| 2014/0061611 A1 | 3/2014 | Sung |
| 2015/0295154 A1 | 10/2015 | Tu et al. |
| 2015/0380612 A1 | 12/2015 | Yang |
| 2016/0315068 A1 | 10/2016 | Lee et al. |
| 2016/0363821 A1 | 12/2016 | Lee et al. |
| 2019/0198565 A1 | 6/2019 | Lee et al. |

* cited by examiner

LIGHT-EMITTING DEVICE

RELATED APPLICATION

This application is a continuation of application Ser. No. 16/595,804 filed Oct. 8, 2019 which claims the right of priority of TW Application Serial No. 107135433, filed on Oct. 8, 2018, the content of which is hereby incorporated by reference in their entirety.

TECHNICAL FIELD

The present disclosure relates to a light-emitting device, in particular a light-emitting device having a plurality of light-emitting units.

DESCRIPTION OF THE RELATED ART

The light-emitting diodes (LEDs) have the characteristics of low power consumption, long operating life, small volume, fast response, and stable optical output so the LEDs are gradually replacing traditional lighting source and are widely used in various lighting devices.

LEDs which have small size have advantages in the applications of high-resolution printers and high-resolution displays. The light-emitting diode has a stack structure including a first semiconductor layer, a second semiconductor layer, and an active stack between the first semiconductor layer and the second semiconductor layer. When the volume of the light-emitting diode is miniaturized, for example, the area of light-emitting diode is less than 2500 $\mu m^2$, the influence of the non-radiative recombination which comes from the lattice dislocations on the side wall of the epitaxial structure and is caused by etching becomes more obvious, and thus the light-emitting efficiency of the light-emitting diode is degraded.

The non-radiative recombination is that holes and electrons combined in the active stack and not released in the form of photons, but released in the form of heat. The non-radiative recombination effect easily occurs at the side surfaces of the light-emitting diode. The non-radiative recombination is caused by damaging the side surfaces of the active stack during manufacturing, for example, cutting or/and etching process, such that the dangling bond of the active stack near the side surfaces (end) absorbs impurity which is close to the edge of the active stack. As the size of the light-emitting diode is miniaturized, electrons and holes diffuse more easily to the side surfaces of the light-emitting diode and the effect of the non-radiative recombination effect is more serious, so that the luminous efficiency of the light-emitting diode is degraded.

SUMMARY OF THE DISCLOSURE

The following description illustrates embodiments and together with drawings to provide a further understanding of the disclosure described above.

A light-emitting device which includes a first light-emitting area, a second light-emitting area, and a third light-emitting area. The first light-emitting area emits a red light and includes a first light-emitting unit. The second light-emitting area emits a blue light and includes a second light-emitting unit. The third light-emitting area emits a green light and includes a third light-emitting unit. The first light-emitting area is larger than the second light-emitting area and larger than the third light-emitting area. Each of the first light-emitting unit, the second light-emitting unit, and the third light-emitting unit has a width of less than 100 μm and a length of less than 100 μm.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1:
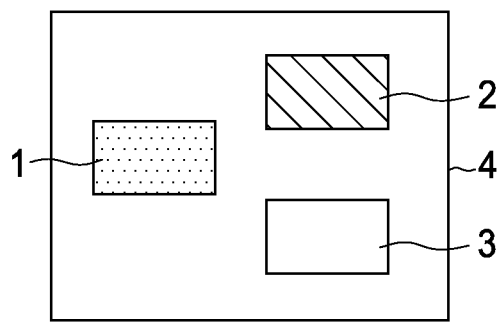
FIG. 1 shows a top view of a light-emitting device in accordance with an embodiment of the present disclosure.

FIG. 1 is a top view of a light-emitting device 100 in accordance with an embodiment of the present disclosure. The light-emitting device 100 can be used for indoor or outdoor display. The light-emitting device 100 can emit a white light. The light-emitting device 100 includes a first light-emitting unit 1, a second light-emitting unit 2, a third light-emitting unit 3, and a supporting body 4. The first light-emitting unit 1 can be a red light-emitting diode having a peak/dominant wavelength ranging of 600 nm to 720 nm. The second light-emitting unit 2 can be a blue light-emitting diode having a peak/dominant wavelength ranging of 430 nm to 490 nm. The third light-emitting unit 3 can be a green light-emitting diode having peak/dominant wavelength ranging of 510 nm to 570 nm. The first light-emitting unit 1, the second light-emitting unit 2, and the third light-emitting unit 3 are disposed on the supporting body 4. The supporting body 4 can be a lead frame or a substrate. The lead frame can include a plurality of conductive terminals (not shown) for electrically connecting the light-emitting units, and a housing (not shown) covering at least a portion of the conductive terminals. Wherein, the housing can optionally have a recess for accommodating the light-emitting units. The material of the substrate can comprise metal, thermoplastic material, thermosetting material, or ceramic material. The metal can comprise aluminum, copper, and the like. The thermosetting material can comprise phenolic resin, epoxy resin, bismaleimide triazine resin, or combination thereof. The thermoplastic material can comprise polyimide resin, polytetrafluorethylene or the like. The ceramic materials can include alumina, aluminum nitride, tantalum carbide, and the like.

The light-emitting unit can be a semiconductor light-emitting element which can emit the non-coherent light and includes a carrier, a first semiconductor layer, an active stack, and a second semiconductor layer. The first semiconductor layer and the second semiconductor layer can be cladding layer or confinement layer. The first semiconductor layer and the second semiconductor layer can provide electrons and holes respectively. The electrons and holes are combined in the active stack to emit light. The first semiconductor layer, the active stack, and the second semiconductor layer can include a semiconductor material of III-V group, such as $Al_xIn_yGa_{(1-x-y)}N$ or $Al_xIn_yGa_{(1-x-y)}P$, where $0 \leq x \leq 1$; $0 \leq y \leq 1$; $(x+y) \leq 1$. Based on the material of the active stack, the light-emitting unit can emit an infrared light, a red light, a green light, a blue light, a violet light, or a ultra-violet light. The carrier can be a growth substrate for epitaxially growing the first semiconductor layer, the active stack, and the second semiconductor layer in sequence thereon; or be a support for the first semiconductor layer, the active stack, and the second semiconductor layer in sequence located thereon after removing the growth substrate. The growth substrate can be made of a material, such as Ge, GaAs, InP, sapphire, SiC, Si, GaN. The support can be $LiAlO_2$, ZnO, AlN, metal, glass, diamond, CVD diamond, Diamond-Like Carbon (DLC). In an embodiment, the light-emitting unit does not have a growth substrate or a support, and has a thickness of about 5 to 10 m.

When the size of the light-emitting unit is miniaturized, for example, the length or width of the light-emitting unit is less than 100 μm, or the light-emitting area is less than 2500 μm$^2$, the influence of non-radiative recombination becomes apparent so that the external quantum efficiency (EQE) of the light-emitting diode decreases and the brightness decreases. When the material of the active stack comprises Al, In, Ga, P, and/or As, the light-emitting unit can emit a red light and have a carrier surface recombination velocity (SRV) of about $1 \times 10^5$ (cm/s), which is faster than those of other materials used for emitting a blue light and a green light, for example, the SRV of gallium nitride (GaN) is about $1 \times 10^4$ (cm/s). When the light-emitting unit can emit a red light and contains a material of Al, In, Ga, P, and/or As, the diffusion length is longer than that of the material of GaN, wherein the diffusion length is about 2 μm. In other words, there is no light emitted in a peripheral region of the light-emitting unit, where in the peripheral region has a width of 2 μm from the edge of the active stack. When the active stack of the light-emitting unit is gallium nitride (GaN), the light-emitting unit can emit a blue light and has a diffusion length is shorter than that of light-emitting unit which can emit a red light. The diffusion length of the light-emitting unit which can emit a blue light is about several hundred nm and less than 2 μm. Therefore, when the size of the light-emitting unit is miniaturized and the material is nitride-based, the non-radiative recombination effect occurring on the edge of the active stack is small, and the area of the non-light-emitting area is also small. By contrast, when the material is Al, In, Ga, P, or As—based, the non-radiative recombination effect on the edge of the active stack is substantial and the area of the non-light-emitting area is large, so that the luminous efficiency and external quantum efficiency (EQE) is degraded.

In one embodiment shown in FIG. 1, the first light-emitting unit 1 emits a red light, the second light-emitting unit 2 emits a blue light, and the third light-emitting unit 3 emits a green light. When each of the light-emitting areas (projected area of the active layer) of the light-emitting units 1, 2, or 3 is about 1500 μm$^2$, for example, the light-emitting unit has a rectangular shape with a length of 50 μm and a width of 30 μm, or the light-emitting unit has a circle shape with a radius of 22 μm, the external quantum efficiency (EQE) of the first light-emitting unit 1 is about 7%, the external quantum efficiency (EQE) of the second light-emitting unit 2 is about 27%, and the external quantum efficiency (EQE) of the third light-emitting unit 3 is about 25%. Therefore, in the case of the light-emitting device 100, the luminous efficiency of the first light-emitting unit 1 is only about ¼ of that of the second light-emitting unit 2. The luminous efficiency of the first light-emitting unit 1 is only about ⅓ of that of the third light-emitting unit 3. In another embodiment, when the sizes of the light-emitting units are similar to each other/the same, the ratio of the luminous efficiency of the first light-emitting unit 1 to the second light-emitting unit 2 is less than ¼, the ratio of the luminous efficiency of the first light-emitting unit 1 to the third light-emitting unit 3 is less than ⅓. When the sizes of the light-emitting units are miniaturized and are similar (or identical) to each other, the luminous efficiency/luminance of the red light-emitting unit is lower than that of the green light-emitting unit and that of the blue light-emitting units. In order to balance the luminance of the red, blue, and green lights of the light-emitting device, it is necessary to increase the light-emitting area of the red light-emitting unit for increasing the amount of red light.

Figure 2:
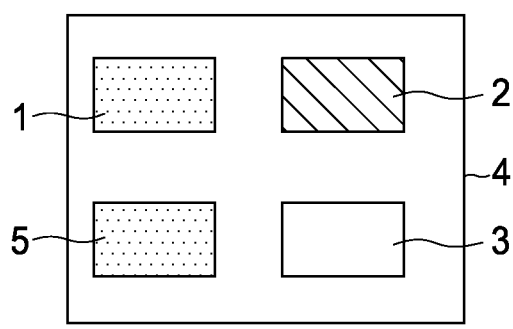
FIG. 2 shows a top view of a light-emitting device in accordance with an embodiment of the present disclosure.

FIG. 2 shows a light-emitting device 200. The light-emitting device 200 can emit a white light. The amount of the red light-emitting units is more than that of the blue light-emitting unit and that of the green light-emitting unit. Therefore, the light-emitting area of the red light is larger than that of the blue light, and the light-emitting area of the red light is larger than that of the green light. The red light emitted from the light-emitting device 200 has a first brightness, the green light emitted from the light-emitting device 200 has a second brightness, and the ratio of the first brightness to the second brightness is between 0.8 and 1.2. In this embodiment, the light-emitting device 200 includes two light-emitting units, a first light-emitting unit 1 and a fourth light-emitting unit 5, which can emit red lights, a second light-emitting unit 2 which can emit a blue light, and a third light-emitting unit 3 which can emit a green light, and a supporting body 4. The light-emitting units 1, 2, 3, and 5 are disposed on the upper surface of the supporting body 4, and the light-emitting surfaces of the light-emitting units 1, 2, 3, and 5 have the same normal direction which is the same as a normal direction of the upper surface of the supporting body 4. Each of the lengths and widths of the light-emitting units 1, 2, 3, and 5 is less than 100 μm, or each of the areas of the light-emitting areas (projected area of the active stack) of the light-emitting units 1, 2, 3, and 5 is less than 0.01 mm$^2$. In one embodiment, each of the light-emitting units has a rectangular shape with a length and a width of less than 70 μm, such as a rectangle with a length of 30 μm and a width of 50 μm. In another embodiment, each of the areas of the light-emitting areas of the light-emitting units 1, 2, 3, 5 (the projected area of the active stack) is less than 2500 μm$^2$. For example, the light-emitting unit has a circle shape with a radius of about 22 μm. Some or all of the light-emitting units 1, 2, 3, and 5 can be electrically connected to the supporting body 4 by flip bonding and/or wire bonding. The size of the light-emitting device 200 is less than 1 mm×1 mm. In one embodiment, the size of the light-emitting device 200 is between 0.1 mm×0.1 mm and 1 mm×1 mm. The shape of the light-emitting unit can be a rectangle, a circle, a triangle, a square, a parallelogram, a trapezoid, or other polygonal shapes. The shape of the light-emitting unit is an exemplary here and is not a limitation of the disclosure. In an embodiment, each of the light-emitting units has a rectangular shape. In another embodiment, the shape of each of the light-emitting units can be the same, different, or some can be the same and some are different. In another embodiment, the number of red light-emitting units is greater than 2, the number of green light-emitting units is at least 1, and the number of blue light-emitting units is at least 1, but the number of red light-emitting units is more than that of green light-emitting unit, and is also more than that of blue light-emitting unit. The materials of the light-emitting units and the supporting body can be referred to the aforementioned descriptions.

Figure 3:
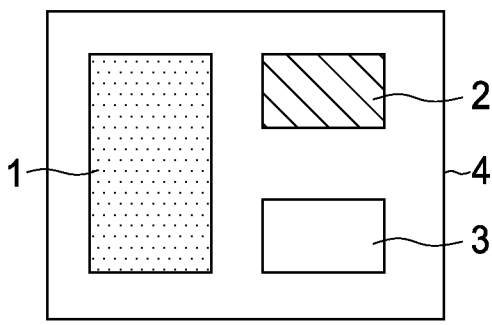
FIG. 3 shows a top view of a light-emitting device in accordance with another embodiment of the present disclosure.

In the aforementioned embodiment, in order to make the brightness of the three colors to be balanced, the light-emitting area of the red light is increased by increasing the number of red light-emitting units, so that the number of red light-emitting units is greater than that of the green light-emitting units and that of the blue light-emitting units. In addition to adjusting the number of red light-emitting units, it is also possible to use a red light-emitting unit which has a larger size along with a blue light-emitting unit and a green-emitting unit which have a smaller size. As shown in FIG. 3, the light-emitting device 300 can emit a white light, the light-emitting area of the red light-emitting unit is larger than that of the blue light-emitting unit, and the light-emitting area of the red light-emitting unit is larger than that of the green light-emitting unit. The light-emitting device 300 can emit a red light having a first brightness, a green light having a second brightness, and the ratio of the first brightness to the second brightness is between 0.8 and 1.2. The light-emitting device 300 includes a first light-emitting unit 1 that emits a red light, a second light-emitting unit 2 that emits a blue light, a third light-emitting unit 3 that emits a green light, and a supporting body 4. Each of the lengths and the widths of the light-emitting units 1, 2, and 3 is less than 100 μm, or each of the sizes (projected area of the active stack) of the light-emitting units 1, 2, and 3 is less than 0.01 mm$^2$. The size of the first light-emitting unit 1 is larger than that of the second light-emitting unit 2 and is also larger than that of the third light-emitting unit 3. In other words, the light-emitting area of the first light-emitting unit 1 is larger than that of the second light-emitting unit 2 and is also larger than that of the third light-emitting unit 3. In an embodiment, the area of the first light-emitting unit 1 is at least 1.5 times of that of the second light-emitting unit 2, for example, 1.5 to 20 times. The area of the first light-emitting unit 1 is at least 1.5 times of that of the third light-emitting unit 3, for example, 1.5 to 20 times. In another embodiment, the area of the first light-emitting unit 1 is at least 2 times of that of the second light-emitting unit 2, and the area of the first light-emitting unit 1 is at least 2 times of that of the third light-emitting unit 3. In another embodiment, each of the second and third light-emitting units 2, 3 has a length and a width of less than 70 μm, such as the light-emitting unit has a rectangular shape with a length of 30 μm and a width of 50 μm. In another embodiment, each of the sizes of the light-emitting units 1, 2, 3, 5 (the projected area of the active stack) is less than 2500 μm$^2$. For example, the light-emitting unit has a circle shape with a radius of about 22 μm. The size of the light-emitting device 300 is less than 1 mm×1 mm. In one embodiment, the size of the light-emitting device 300 is between 0.1 mm×0.1 mm and 1 mm×1 mm. The shape of the light-emitting unit can be a rectangle, a circle, a triangle, a square, a parallelogram, a trapezoid, or other polygonal shapes. The shape of the light-emitting unit is an exemplary here and is not a limitation of the disclosure. In an embodiment, each of the light-emitting units has a rectangular shape. In another embodiment, the shape of each of the light-emitting units can be different, or some can be the same and some are different. Some or all of the light-emitting units 1, 2, and 3 can be electrically connected to the supporting body 4 by flip bonding and/or wire bonding. The materials of the light-emitting units 1, 2, 3, and the supporting body 4 can be referred to the aforementioned descriptions.

Figure 4A:
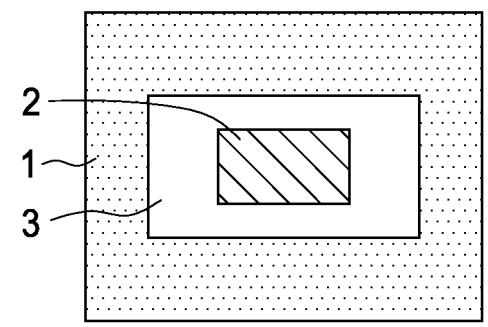
FIG. 4A shows a top view of a light-emitting device in accordance with another embodiment of the present disclosure.
Figure 4B:
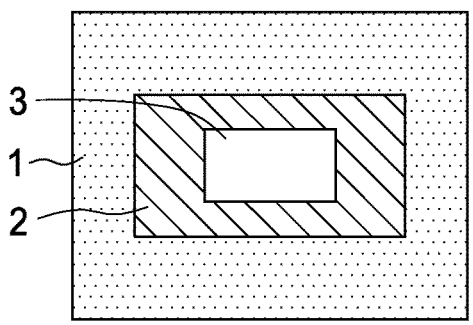
FIG. 4B shows a top view of a light-emitting device in accordance with another embodiment of the present disclosure.

The light-emitting device of the aforementioned embodiment, the light-emitting units 1, 2, and 3 are arranged along a horizontal direction on the upper surface of the supporting body 4 (the arrangement direction is perpendicular to the normal direction of the upper surface of the supporting body 4), therefore, in the top view, the total area of the light-emitting device is greater than/or equal to the summation of the areas of the first light-emitting unit 1, the second light-emitting unit 2, and the third light-emitting unit 3. In order to reduce the size, vertical arrangement can be used to make the total area of the light-emitting device smaller than the summation of the areas of the light-emitting units. FIG. 4A shows a light-emitting device 401, which can emit a white light. The light-emitting device 401 includes a first light-emitting unit 1 which can emit a red light, a second light-emitting unit 2 which can emit a blue light, and a third light-emitting unit 3 which can emit a green light, and a supporting body (not shown). The light-emitting surfaces of the light-emitting units 1, 2, and 3 have the same normal direction. Each of the lengths and the widths of the light-emitting units 1, 2, and 3 is less than 100 μm, or each of the sizes (projected area of the active stack) of the light-emitting units 1, 2, 3 is less than 0.01 mm$^2$. The size of the first light-emitting unit 1 is larger than that of the second light-emitting unit 2 and is also larger than that of the third light-emitting unit 3. The third light-emitting unit 3 is disposed on the first light-emitting unit 1 and covers a portion of the light-emitting surface of the first light-emitting unit 1. The second light-emitting unit 2 is disposed on the third light-emitting unit 3 and covers a portion of the light-emitting surface of the third light-emitting unit 3. In the top view, the second light-emitting unit 2 fully overlaps the third light-emitting unit 3, and the outer side of the second light-emitting unit 2 is surrounded by a portion of the light-emitting surface of the third light-emitting unit 3. The second light-emitting unit 2 and the third light-emitting unit 3 fully overlap the first light-emitting unit 1, and the outer side of the third light-emitting unit 3 is surrounded by a portion of the light-emitting surface of the first light-emitting unit 1. In an embodiment, the light emitted from the first light-emitting unit 1 can penetrate the second light-emitting unit 2 and the third light-emitting unit 3, and the light emitted from the third light-emitting unit 3 can penetrate the second light-emitting unit 2. The area of the first light-emitting unit 1 is larger than that of the third light-emitting unit 3, and larger than that of the second light-emitting unit 2. For example, the area of the first light-emitting unit 1 is at least 1.5 times of that of the second light-emitting unit 2, for example, 1.5 to 20 times. The area of the first light-emitting unit 1 is at least 1.5 times of that of the third light-emitting unit 3, for example, 1.5 to 20 times. In another embodiment, the second light-emitting unit 2 and the third light-emitting unit 3 comprise a reflective layer, so that the light of the light-emitting unit 2 and the light-emitting unit 3 are reflected by the reflective layer and are emitted upward to increase the brightness. Therefore, the light emitted from the first light-emitting unit 1 does not penetrate the second light-emitting unit 2 and the third light-emitting unit 3, and the light emitted from the second light-emitting unit 2 does not penetrate the third light-emitting unit 3. The uncovered light-emitting area of the first light-emitting unit 1 is larger than that of the third light-emitting unit 3, and is larger than the light-emitting area of the second light-emitting unit 2. For example, the uncovered light-emitting area of the first light-emitting unit 1 is at least 1.5 times of light-emitting area of the second light-emitting unit 2, for example, 1.5 to 20 times. The uncovered light-emitting area of the first light-emitting unit 1 is at least 1.5 times of that of the third light-emitting unit 3, for example, 1.5 to 20 times. In one embodiment, each of the lengths and the widths of the second and third light-emitting units is less than 70 µm. For example, the second and third light-emitting units have rectangular shapes with a length of 30 µm and a width of 50 µm. In another embodiment, each of the sizes of the light-emitting units 1, 2, 3 (the projected area of the active stack) is less than 2500 µm². For example, the light-emitting unit has a circle shape with a radius of about 22 µm. In the top view, the first light-emitting unit 1, the second light-emitting unit 2, and the third light-emitting unit 3 have the same geometric center. In another embodiment, in the top view, the geometric centers of the first light-emitting unit 1, the second light-emitting unit 2, and the third light-emitting unit are different. In another embodiment, as shown in FIG. 4B, in the light-emitting device 402, the first light-emitting unit 1 can emit a red light, the second light-emitting unit 2 can emit a blue light, and the third light-emitting unit 3 can emit a green light. The second light-emitting unit 2 is disposed on the first light-emitting unit 1, and covers a portion of the first light-emitting unit 1, and the third light-emitting unit 3 is disposed on the second light-emitting unit 2, and covers a light-emitting surface of the second light-emitting unit 2.

The light-emitting units 1, 2, and 3 are joined by a bonding material, and the bonding material can include glue. The glue can be polyimide, benzocyclobutene (BCB), perfluorocyclobutane (PFCB), epoxy, Su8, or spin-on glass (SOG). In another embodiment, there is no bonding material between the light-emitting units 1, 2 and between the light-emitting units 2, 3. After the light-emitting units 1, 2, and 3 are disposed on the supporting body, a glue material covers the light-emitting units 1, 2, and 3 to protect the light-emitting units 1, 2, and 3. The material of the glue can refer to the aforementioned bonding material. The light-emitting units 1, 2, 3 can be electrically connected to an external power source by flip bonding or wire bonding. In one embodiment, the first light-emitting unit 1 is electrically connected to an external power source by flip bonding, and the second light-emitting unit 2 and the third light-emitting unit 3 are electrically connected to an external power source by wire bonding. In another embodiment, the first light-emitting unit 1, the second light-emitting unit 2, and the third light-emitting unit 3 are electrically connected to an external power source by wire bonding. The shape of the light-emitting unit can be a rectangle, a circle, a triangle, a square, a parallelogram, a trapezoid, or other polygonal shapes. The shape of the light-emitting unit is an exemplary here and is not a limitation of the disclosure. In an embodiment, each of the light-emitting units has a rectangular shape. In another embodiment, the shape of each of the light-emitting units can be different, or some can be the same and some are different. The supporting body (not shown) is located under the first light-emitting unit 1 and can be slightly larger than the first light-emitting unit 1. In the top view, the total area of the light-emitting device 401 is smaller than summation of the areas of the first light-emitting unit 1, the second light-emitting unit 2, and the third light-emitting unit 3. In another embodiment, in a top view, the supporting body (not shown) is equal to or slightly smaller than the first light-emitting unit 1, and then the area of the light-emitting device 401 is equal to that of the first light-emitting unit 1.

Figure 5:
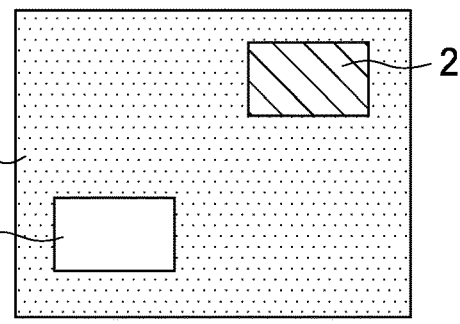
FIG. 5 shows a top view of a light-emitting device in accordance with another embodiment of the present disclosure.

In another embodiment, in order to reduce the size of the light-emitting device in a top view, and also to reduce the thickness of the light-emitting device in a side view, some of the light-emitting units can be arranged along a vertical direction and some of the light-emitting units can be arranged along a horizontal direction. As shown in FIG. 5, the light-emitting device 500 which can emit a white light, and includes a first light-emitting unit 1 which can emit a red light, a second light-emitting unit 2 which can emit a blue light, and a third light-emitting unit 3 which can emit a green light. The light-emitting surfaces of the light-emitting units 1, 2, and 3 have the same normal direction. Each of the lengths and the widths of the light-emitting units 1, 2, and 3 is less than 100 µm, or each of the sizes (projected area of the active stack) of the light-emitting units is less than 0.01 mm². The size of the first light-emitting unit 1 is larger than that of the second light-emitting unit 2, and is also larger than that of the third light-emitting unit 3. The second light-emitting unit 2 is disposed on the first light-emitting unit 1 and covers a first portion of the light-emitting surface of the first light-emitting unit 1. The third light-emitting unit 3 is disposed on the first light-emitting unit 1 and covers the second portion of the light-emitting surface of the first light-emitting unit 1. The second portion is different from the first portion. In a top view, the second light-emitting unit 2 is physically separated from the third light-emitting unit 3 and fully overlaps the first light-emitting unit 1, the outer side of the second light-emitting unit 2 is surrounded by a portion of the light-emitting surface of first light-emitting unit 1. The second light-emitting unit 2 and the first light-emitting unit 1 are arranged along a vertical direction(the arrangement direction is parallel to the normal direction of the light-emitting surface of the first light-emitting unit 1), the third light-emitting unit 3 and the first light-emitting unit 1 are arranged along a vertical direction(the arrangement direction is parallel to the normal direction of the light-emitting surface of the first light-emitting unit 1), and the second light-emitting unit 2 and the third light-emitting unit 3 are disposed on the first light-emitting unit 1 so the arrangement direction is perpendicular to the normal direction of the light-emitting surface of the first light-emitting unit 1. In an embodiment, the light emitted from the first light-emitting unit 1 can penetrate the second light-emitting unit 2 and the third light-emitting unit 3, and the light-emitting area of the first light-emitting unit 1 is larger than that of the third light-emitting unit 3 and larger than that of the second light-emitting units 2. For example, the light-emitting area of the first light-emitting unit 1 is at least 1.5 times of that of the second light-emitting unit 2, for example, 1.5 to 20 times. The area of the first light-emitting unit 1 is at least 1.5 times of that of the third light-emitting unit 3, for example, 1.5 to 20 times. In another embodiment, the second light-emitting unit and the third light-emitting unit include a reflective layer, so that the light emitted from the light-emitting layer of the light-emitting units 2, 3 is reflected by the reflective layer and is emitted upward to increase the brightness. Therefore, the light emitted from the first light-emitting unit 1 does not penetrate the second light-emitting unit 2 and the third light-emitting unit 3. The uncovered light-emitting area of the first light-emitting unit 1 is larger than the light-emitting area of the second light-emitting unit 2 and the light-emitting area of the third light-emitting unit 3. For example, the uncovered light-emitting area of the first light-emitting unit 1 is at least 1.5 times of the area of the second light-emitting unit, for example, 1.5 to 20 times. The uncovered light-emitting area of the first light-emitting unit 1 is at least 1.5 times of the area of the second light-emitting unit 2, for example, 1.5 to 20 times. In one embodiment, each of the length and the width of the light-emitting unit is less than 70 µm. For example, the light-emitting unit has a rectangular shape with a length of 30 µm and a width of 50 µm. In another embodiment, each of the sizes of the light-emitting units 1, 2, 3 (the projected area of the active stack) is less than 2500 µm². For example, the light-emitting unit has a circle shape with a radius of about 22 µm. In a top view of FIG. 5, the locations of the second light-emitting unit 2 and the third light-emitting unit 3 are close to two opposite diagonal ends of the light-emitting surface of the first light-emitting unit 1, and a distance between the geometric centers of the second light-emitting unit 2 and the first light-emitting unit 1 are substantially the same as that between the geometric centers of the second light-emitting unit 3 and the first light-emitting unit 1. In another embodiment, the common geometric center of the second light-emitting unit 2 and the third light-emitting unit 3 is different from the geometric center of the first light-emitting unit 1 in the top view.

The light-emitting units 2, 3 and the light-emitting unit 1 are joined by a bonding material, and the bonding material can include glue. The glue can be polyimide, benzocyclobutene (BCB), perfluorocyclobutane (PFCB), epoxy, Su8, or spin-on glass (SOG). In another embodiment, there is no bonding material between the light-emitting units 1, 2 and between the light-emitting units 2, 3. After the light-emitting units 1, 2, and 3 are disposed on the supporting body, a glue material covers the light-emitting units 1, 2, and 3 to protect the light-emitting units 1, 2, and 3. The material of the glue can be the aforementioned bonding material. The light-emitting units 1, 2, and 3 can be electrically connected to an external power source by flip bonding or wire bonding. In one embodiment, the first light-emitting unit 1 is electrically connected to an external power source by flip bonding, and the second light-emitting unit 2 and the third light-emitting unit 3 are electrically connected to an external power source by wire bonding. In another embodiment, the first light-emitting unit 1, the second light-emitting unit 2, and the third light-emitting unit 3 are electrically connected to an external power source by wire bonding. The shape of the light-emitting unit can be a rectangle, a circle, a triangle, a square, a parallelogram, a trapezoid, or other polygonal shapes. The shape of the light-emitting unit is an exemplary here and is not a limitation of the disclosure. In an embodiment, each of the light-emitting units has a rectangular shape. In another embodiment, the shape of each of the light-emitting units can be different, or some can be the same and some are different.

Figure 6:
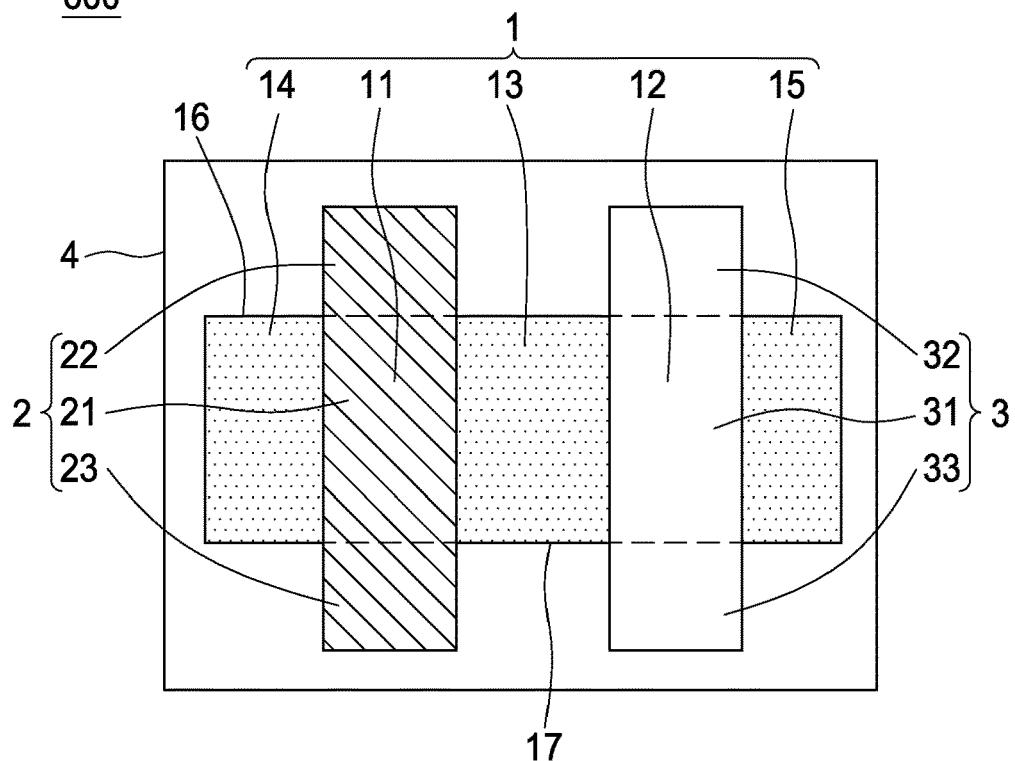
FIG. 6 shows a top view of a light-emitting device in accordance with another embodiment of the present disclosure.

In another embodiment, all of the light-emitting units 1, 2, 3 are flip chips and are bonded to the supporting body by flip bonding. FIG. 6 shows a light-emitting device 600 which can emit a white light, and includes a first light-emitting unit 1 which can emit a red light, a second light-emitting unit 2 which can emit a blue light, and a third light-emitting unit 3 which can emit a green light, and a supporting body 4 which the first light-emitting unit 1, the second light-emitting unit 2, and the third light-emitting unit 3 are disposed on. The light-emitting surfaces of the light-emitting units 1, 2, and 3 have the same normal direction. Each of the lengths and widths of the light-emitting units 1, 2, and 3 is less than 100 µm, or each of the sizes (projected area of the active stack) of the light-emitting units is less than 0.01 mm². The size of the first light-emitting unit 1 is larger than that of the second light-emitting unit 2, and is also larger than that of the third light-emitting unit 3. The second light-emitting unit 2 is disposed on the first light-emitting unit 1 and covers a first portion 11 of the light-emitting surface of the first light-emitting unit 1. The third light-emitting unit 3 and the second light-emitting unit 2 are arranged along a horizontal direction on the first light-emitting unit 1. The third light-emitting unit 3 is disposed on the first light-emitting unit 1 and covers the second portion 12 of the light-emitting surface of the first light-emitting unit 1. The second portion 12 is different from the first portion 11. In the top view, the second light-emitting unit 2 is physically separated from the third light-emitting unit 3. The second light-emitting unit 2 partially overlaps the first light-emitting unit 1. The longitudinal direction of the second light-emitting unit 2 is perpendicular to the longitudinal direction of the first light-emitting unit 1. The third light-emitting unit 3 partially overlaps the first light-emitting unit 1. The longitudinal direction of the third light-emitting unit 3 is perpendicular to the longitudinal direction of the first light-emitting unit 1. The second light-emitting unit 2 and the first light-emitting unit 1 are arranged along a vertical direction (the arrangement direction is parallel to the normal direction of the light-emitting surface of the first light-emitting unit 1). The third light-emitting unit 3 and the first light-emitting unit 1 are arranged along a vertical direction (the arrangement direction is parallel to the normal direction of the light-emitting surface of the first light-emitting unit 1). The second light-emitting unit 2 and the third light-emitting unit 3 are disposed on the first light-emitting unit 1 so the arrangement direction is perpendicular to the normal direction of the light-emitting surface of the first light-emitting unit 1. In order to facilitate the stacking of the second light-emitting unit 2 and the third light-emitting unit 3 on the first light-emitting unit 1, the first light-emitting unit 1 does not have a growth substrate or has a thinned growth substrate, so that the thickness of the first light-emitting unit 1 is thinner than that of the second light-emitting unit 2 and that of the third light-emitting unit 3. In another embodiment, in order to reduce the thickness of the light-emitting device, the light-emitting units 1, 2, and 3 do not have the growth substrate or have a thinned growth substrate.

The light-emitting units 2, 3 and the light-emitting unit 1 are joined by a bonding material, and the bonding material can include glue. The glue can be polyimide, benzocyclobutene (BCB), perfluorocyclobutane (PFCB), epoxy, Su8, or spin-on glass (SOG). In another embodiment, there is no bonding material between the light-emitting units 1, 2 and between the light-emitting units 1, 3. After the light-emitting units 1, 2, and 3 are disposed on the supporting body 4, a glue material covers the light-emitting units 1, 2, and 3 to protect the light-emitting units 1, 2, and 3. In detail, the glue can continuously cover the outer side surfaces and the light-emitting surfaces of the light-emitting units 1, 2, and 3. The material of the glue can refer to aforementioned description.

As shown in FIG. 6, in a top view, the second light-emitting unit 2 includes a first portion 21 which overlaps the first light-emitting unit 1, a second portion 22 and a third portion 23 which do not overlap the first light-emitting unit 1. The second portion 22 and the third portion 23 are located on opposite sides of the first portion 21. The second portion 22 is located outside the front side 16 of the first light-emitting unit 1, and the third portion 23 is located outside the rear side 17 opposite to the front side 16 of the first light-emitting unit 1. The first portion 21 is located between the front side 16 and the rear side 17 of the first light-emitting unit 1. The third light-emitting unit 3 includes a first portion 31 overlapping the first light-emitting unit 1, a second portion 32 and a third portion 33 which do not overlap the first light-emitting unit 1. The second portion 32 and the third portion 33 are located at opposite sides of the first portion 31. The second portion 32 is located outside the front side 16 of the first light-emitting unit 1, and the third portion 33 is located outside the rear side 17 opposite to the front side 16 of the first light-emitting unit 1. The first portion 31 is located between the front side 16 and the rear side 17 of the first light-emitting unit 1. The first light-emitting unit 1 has a first portion 11 covered by the second light-emitting unit 2, a second portion 12 covered by the third light-emitting unit 3, and a third portion 13, a fourth portion 14, and a fifth portion 15 which are not covered by the second light-emitting unit 2 and the third light-emitting unit 3. The third portion 13 of the light-emitting surface of the first light-emitting unit 1 is located between the second light-emitting unit 2 and the third light-emitting unit 3. The fourth portion 14 of the light-emitting surface of the first light-emitting unit 1 is located on the left side of the first light-emitting unit 1 and outside the left side of the second light-emitting unit 2. The fifth portion 15 of the light-emitting surface of the first light-emitting unit 1 is located on the right side of the first light-emitting unit 1 and outside the right side of the third light-emitting unit 3. The light-emitting area (the summation of the areas of the third portion 13, the fourth portion 14, and the fifth portion 15) that are not been covered of the first light-emitting unit 1 is larger than the light-emitting area of the second light-emitting unit 2 (the summation of the areas of the first portion 21, the second portion 22, and the third portion 23), and is also larger than the light-emitting area of the third light-emitting unit 3 (the summation of the first portion 31, the second portion 32, and the third portion 33). In an embodiment, the light emitted from the first light-emitting unit 1 can penetrate the second light-emitting unit 2 and the third light-emitting unit 3, and the area of the first light-emitting unit 1 is larger than that of the third light-emitting unit 3, and larger than that of the second light-emitting unit 2. For example, the light-emitting area of the first light-emitting unit 1 is at least 1.5 times of that of the second light-emitting unit 2, for example, 1.5 to 20 times. The area of the first light-emitting unit 1 is at least 1.5 times of that of the third light-emitting unit 3, for example, 1.5 to 20 times. In another embodiment, the light emitted from the first light-emitting unit 1 does not penetrate the second light-emitting unit 2 and the third light-emitting unit 3, and the uncovered light-emitting area of the first light-emitting unit 1 is at least 1.5 times of the light-emitting area of the second light-emitting unit 2, for example, 1.5 to 20 times. In one embodiment, each of the lengths and the widths of the second and third light-emitting units is less than 70 μm, such as the second and third light-emitting units have rectangular shape with a length of 30 μm and a width of 50 μm. The electrode pads of the light-emitting units 1, 2, and 3 are disposed on the bottom surface corresponding to the light-emitting surfaces of each of the light-emitting units, and are electrically connected to the supporting body 4 by flip bonding.

In another embodiment, the light-emitting units 2, 3 can be partially located at the leftmost or rightmost side of the first light-emitting unit 1, thus the first light-emitting unit 1 has at least one uncovered light-emitting area. For example, the second light-emitting unit 2 is located at the leftmost side of the first light-emitting unit 1, the third light-emitting unit 3 is located at the rightmost side of the first light-emitting unit 1 and physically separated from the second light-emitting unit 2, and then the first light-emitting unit 1 has one uncovered light-emitting area. In another embodiment, the light-emitting units 2, 3 can be arranged side by side and disposed on the first light-emitting unit 1, so that the first light-emitting unit 1 has at least one uncovered light-emitting area. For example, the light-emitting units 2, 3 are located between the leftmost side and the rightmost side of the first light-emitting unit 1, and the second light-emitting unit 2 and the third light-emitting unit 3 are arranged along a horizontal direction on the light-emitting unit 1 and adjacent to each other without a gap therebetween. Therefore, the first light-emitting unit 1 has two separated and uncovered light-emitting areas.

Figure 7A:
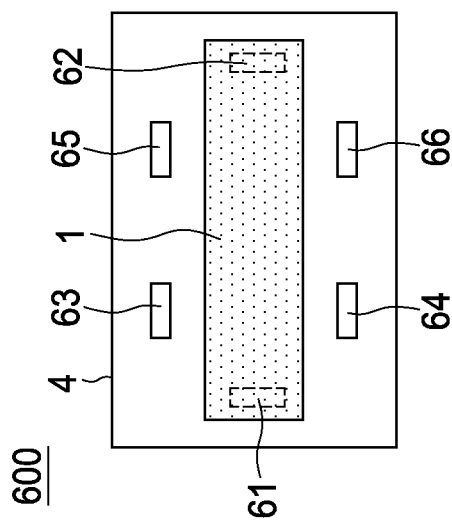
FIGS. 7A~7E show steps of manufacturing a light-emitting device in accordance with an embodiment of the present disclosure.
Figure 7B:
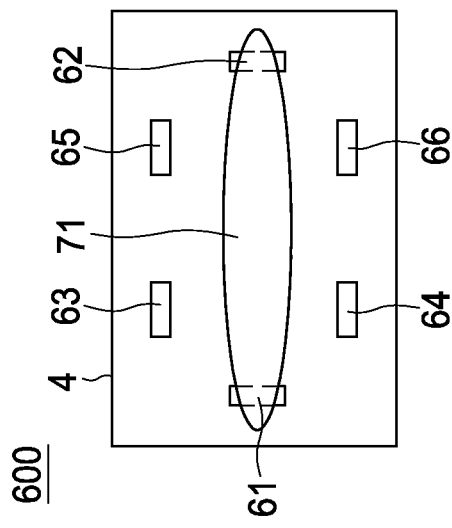
Figure 7C:
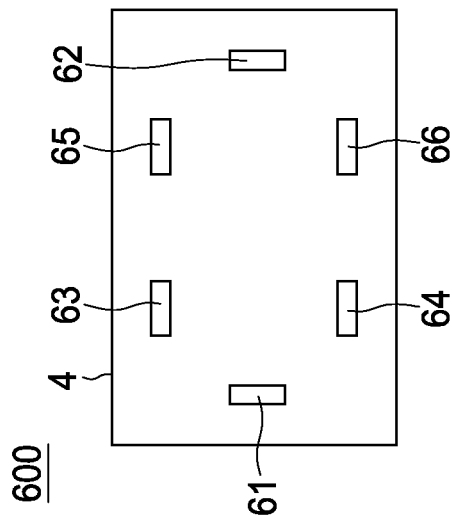
Figure 7D:
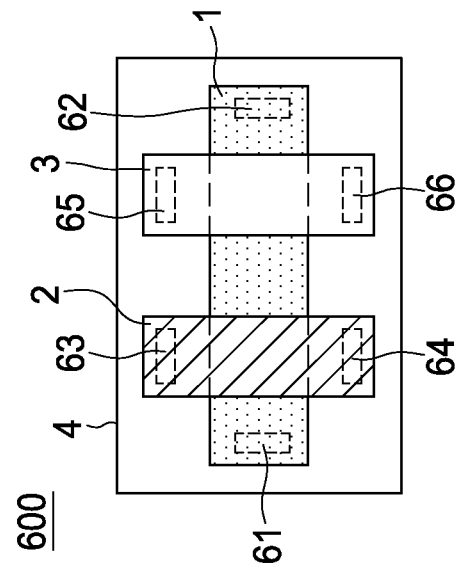
Figure 7E:
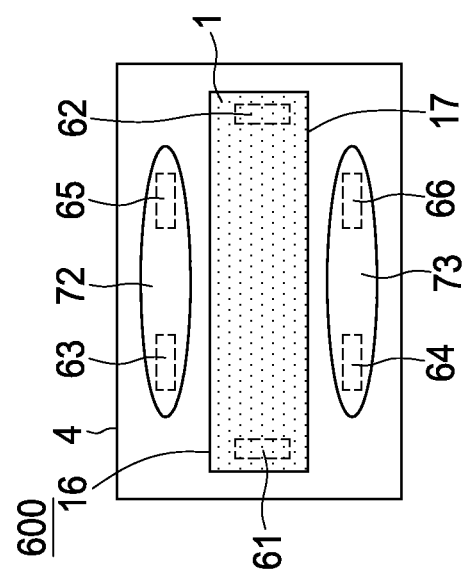

FIGS. 7A to 7E show steps of manufacturing a light-emitting device 600 in accordance with an embodiment of the present disclosure. As shown in FIG. 7A, a supporting body 4 is provided. The supporting body 4 has a first group of bonding pads 61, 62, a second group of pads 63, 64, a third group of pads 65, 66, and optionally has a conductive structure (not shown) for electrically connecting the light-emitting units. The first group of pads 61, 62 corresponds to the electrode pads of the first light-emitting unit 1, the second group of pads 63, 64 corresponds to the electrode pads of the second light-emitting unit 2, and the third group of pads 65, 66 corresponds to the third light-emitting unit 3 electrodes. As shown in FIG. 7B, a paste 71 is formed on the first group of pads 61, 62. The paste 71 includes an insulating material and a plurality of conductive particles dispersed in the insulating material. The method of forming the paste can be the patterning jig, such as a stencil, such that the paste 71 does not cover the second group of pads 63, 64 and the third group of pads 65, 66. In an embodiment, the pads 61 and the pads 62 separated from each other are covered by the same paste 71. In another embodiment, the pads 61 and pads 62 separated from each other are covered by two physically separated pastes. As shown in FIG. 7C, the first light-emitting unit 1 which is a flip chip is placed on the corresponding first group of pads 61, 62 and is in contact with the paste 71. Then, a thermal curing step is performed to bond the first light-emitting unit 1 with the first group of pads 61, 62. As shown in FIG. 7D, the paste 72 is formed on the pads 63 and 65 which are outside the front side 16 of the first light-emitting unit 1, wherein the pads 63 and 65 respectively belong to the second group of pads and the third group of pads. The paste 73 is on the pads 64 and 66 which are outside the rear side 17 of the first light-emitting unit 1, wherein the pads 64 and 66 respectively belong to the second group of pads and the third group of pads. The method of forming the paste can be the patterning jig, such that the paste 72 does not cover the first light-emitting unit 1 and the pads 64, 66, and the paste 73 does not cover the first light-emitting unit 1 and the pads 63, 65. In one embodiment, the pads 63 and 65 separated from each other are covered by the same paste 72, and the pads 64 and pads 66 separated from each other are covered by the same paste 73. In another embodiment, the pads 63, 64, 65, 66 separated from each other are covered by four physically separated pastes. As shown in FIG. 7E, the second light-emitting unit 2 which is a flip chip is placed on the corresponding second group of pads 63, 64 and is in contact with the pastes 72 and 73. The third light-emitting unit 3 which is a flip chip is placed on the corresponding third group of pads 65, 66 and is in contact with the pastes 72 and 73. Then, a thermal curing step is performed to bond the second light-emitting unit 2 with the second group of pads 63, 64, and bond the third light-emitting unit 3 with the third group of pads 65, 66 to complete the fabrication of the light-emitting device.

Figure 8A:
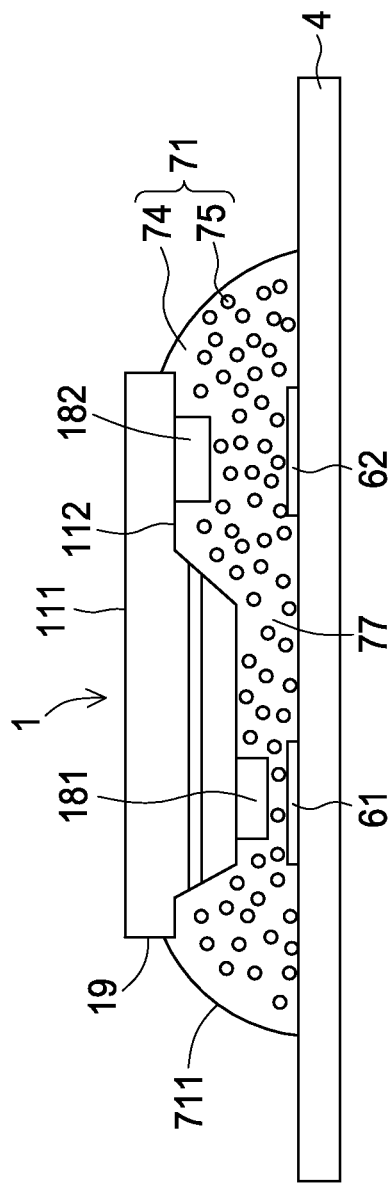
FIGS. 8A~8B show a bonding process of a light-emitting unit and the supporting body in accordance with an embodiment of the present disclosure.
Figure 8B:
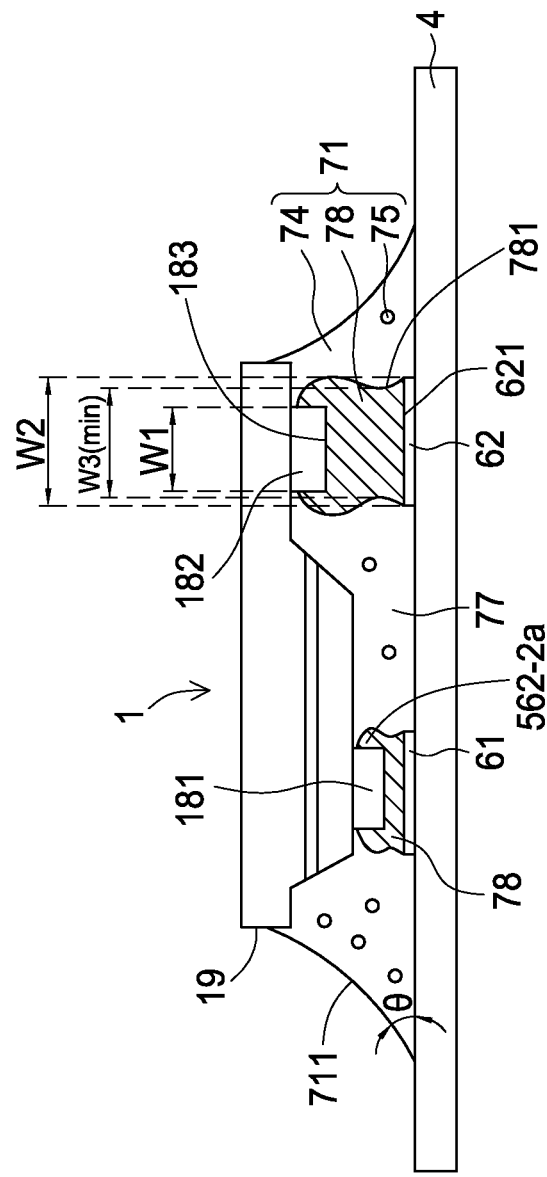

FIGS. 8A~8B show steps of bonding the light-emitting units shown in FIGS. 7A~7E to a supporting body. FIG. 8A shows the structure before thermal curing, and FIG. 8B shows the structure after thermal curing. Taking the first light-emitting unit 1 as an example, as shown in FIG. 8A, the first light-emitting unit 1 includes two electrode pads 181, 182 disposed on a bottom surface 112 corresponding to the light-emitting surface 111. The electrode pads 181, 182 respectively face the first group of pads 61, 62 on the supporting body 4, and the paste 71 is disposed between the first light-emitting unit 1 and the supporting body 4. As shown in FIG. 8A, before thermal curing, the paste 71 includes an insulating material 74 and a plurality of conductive particles 75 dispersed in the insulating material 74. The method of bonding the first light-emitting unit 1 includes a thermal curing. During the curing process, the viscosity of the insulating material 74 is first decreased and then raised, and the conductive particles 75 are gathered in a region which is between or around the electrode pads 181, 182 of the first light-emitting unit and the first group of pads 61, 62. FIG. 8B shows the state after thermal curing. As shown in FIG. 8B, after the thermal curing, most of the conductive particles 75 are concentrated and formed a conductive structure 78 which is between the electrode pads 181, 182 of the first light-emitting unit and the first group of pads 61, 62. The insulating material 74 forms a non-conductive structure 77 surrounding the conductive structure 78. A few of the conductive particles 75 disperses in the non-conductive structure 77. The average density of the conductive particles 75 in the conductive structure 78 is larger than that in the non-conductive region 77. In an embodiment, the conductive structure 78 does not have the insulating material 74.

The conductive particles 75 can include a metal with a low melting temperature of less than 210° C., or an alloy with low liquidus melting temperature of less than 210° C. The metal can be an element, a compound, or an alloy, such as Bi, Sn, Ag, In, or an alloy thereof. In one embodiment, the metal has a low melting temperature of less than 170° C. or the alloy has a liquidus melting temperature of less than 170° C. The material of the alloy with the low liquidus melting temperature can be a Sn—In alloy or a Sn—Bi alloy. The insulating material 74 can be a thermosetting polymer such as epoxy, silicone, polymethyl methacrylate, and episulfide. The insulating material 74 can be cured at a curing temperature. In an embodiment, the melting temperature of the conductive particles 75 is lower than the curing temperature of the insulating material 74. Before the thermal curing, FIG. 8A shows the particle size of the conductive particles 75 is defined as the diameter of the conductive particles 75, which is between 5 μm and 50 μm. The shortest distance between the two electrode pads 181, 182 is preferably more than twice of the particle size of the conductive particles 75. If the first light-emitting unit 1 is a rectangular shape with a size of less than 100 μm×100 μm, for example, 80 μm×80 μm, or 70 μm×50 μm, the shortest distance between the two electrode pads 181, 182 of the first light-emitting unit 1 is preferably not more than 50 μm, for example: no more than 40 μm, 30 μm, or 20 μm.

After thermal curing, FIG. 8B shows the conductive particles 75 are aggregated into a bulk and be a conductive structure 78. The conductive structure 78 covers at least one side surface of the electrode pads 181, 182, and the pads 61, 62. The conductive structure 78 directly contacts the corresponding electrode pads 181, 182 and pads 61, 62 to provide electrical conduction. The external power can drive the light-emitting unit 1 through the pads 61, 62, the conductive structure 78, the electrode pads 181, 182. The insulating structure 77 surrounds the outer surfaces of the conductive structure 78, the electrode pads 181, 182, the pads 61, 62. The conductive particles 75 in the non-conductive region 77 are distributed discretely and surrounded by the insulating material 74. Therefore, the conducting current cannot pass through the non-conductive region 77. The non-conductive region 77 can enhance the bonding strength between the light-emitting unit 1 and the supporting body 4 and avoid the conductive material from oxidation due to contacting the external environment, and also can prevent the conductive structure 78 from softening or melting due to high temperature environment that may cause a short circuit problem. In a cross-sectional view, taking the corresponding electrode pad 182 and the pad 62 as an example, the bottom end of the conductive structure 78 (the end contacting the pad 62) completely covers the top surface 624 of the pad 62, and the top end of the conductive structure 78 (the end contacting the electrode pad 182) completely covers the bottom surface 183 of the electrode pad 182. The conductive structure 78 has a necking shape, and the outer side surface 781 of the conductive structure 78 has a surface with a concave portion and a convex portion. In detail, the electrode pad 182 has a width W1, the pad 62 has a width W2, and the width W2 of the pad 62 is larger than or equal to the width W1 of the electrode pad 182. The conductive structure 78 has a width W3 that is not a constant value along the normal direction of the supporting body 4. The conductive structure 78 has a minimum width W3 (min) at the necking portion between the electrode pad 182 and the pad 62. The minimum width W3 (min) of the conductive structure 78 is smaller than the width W1 of the electrode pad 182 or/and the width W2 of the pad 62. In another embodiment, the outer side surface 781 of the conductive structure 78 is a convex arc shape so the conductive structure 78 does not have the necking portion. In another embodiment, the outer side surface 781 of the conductive structure 78 is a flat surface.

As shown in FIG. 8B, the outermost surface 711 of the paste 71 has a curved shape and extends from the supporting body 4 to the outer side surface 19 of the light-emitting unit 1. The shape of the paste 71 changes after thermal curing (compared to FIG. 8A), that is, the paste 71 has a different shape before and after the thermal curing. The paste 71 covers a portion of the outer side surface 19 of the light-emitting unit 1. More specifically, after thermal curing, as shown in FIG. 8B, the outermost surface 711 of the paste 71 has an angle θ with respect to the supporting body 4, and the angle θ gradually increases along the direction of the outermost surface 711 toward the outer side surface 19 of the light-emitting unit 1.

Figure 9:
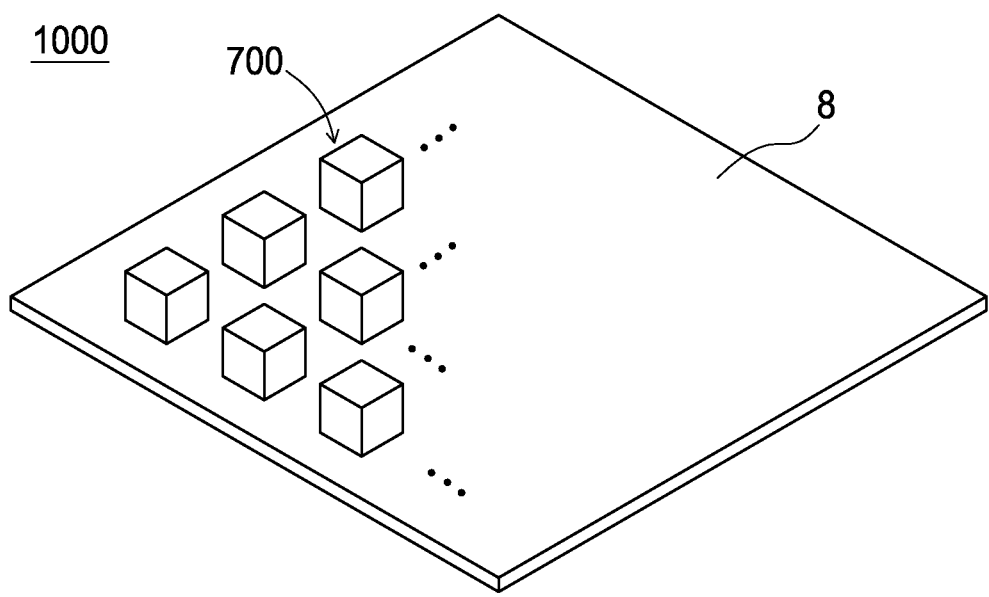
FIG. 9 shows a display module in accordance with an embodiment of the present disclosure.

FIG. 9 is a view of a display module 1000 according to an embodiment of the present disclosure. The display module 1000 includes a substrate 8, such as a circuit substrate, and a plurality of light-emitting devices 700. The plurality of light-emitting devices 700 can be the aforementioned light-emitting devices 100, 200, 300, 401, 402, 500, 600, or a combination thereof. In one embodiment, the plurality of light-emitting devices 700 is arranged in an array on the substrate 8 and electrically connected to a circuit (not shown) on the substrate 8. The surface of the substrate 8 can have a light-absorbing layer (not shown) to improve the contrast of the display module 1000 when displaying. The light-absorbing material is preferably the light-blocking material which does not reflect light and has dark color, such as black, brown, or gray. The light-blocking material is a dark and opaque material. The opaque material can include bismaleimide triazine resin (BT) which is light yellow, and a surface of the BT is covered by a material that can block visible light, such as black ink, or a light-shielding material. The light-shielding material can include metal, resin, or graphite. The metal can be chromium. The resin can include polyimide (PI) or acrylate, and a material which can absorb light, such as carbon, titanium oxide or the like, or a dark pigment, dispersed in the resin.

Figure 10:
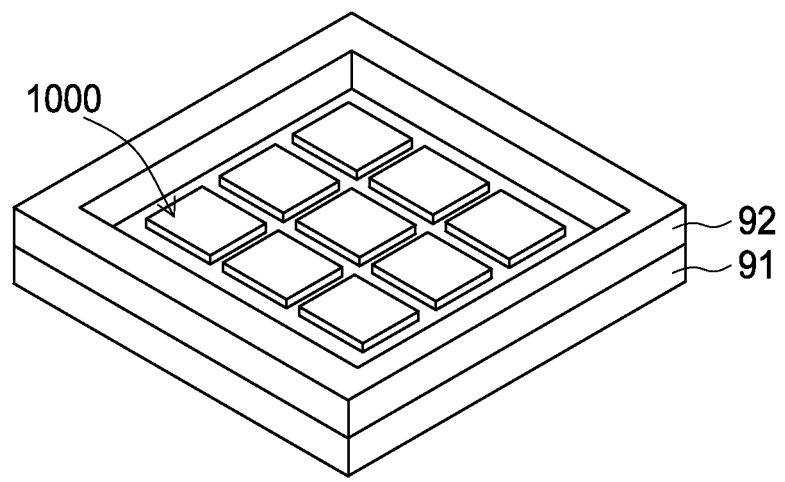
FIG. 10 shows a display apparatus in accordance with an embodiment of the present disclosure.

FIG. 10 is a view of a display device 2000 in accordance with an embodiment of the present disclosure. The display device 2000 includes a carrier substrate 91. The plurality of display modules 1000 are formed on the carrier substrate 91. A frame 92 surrounds the plurality of display modules 1000, and a plate 93 covers the display module 1000 and the frame 92. In an embodiment, the spacing between adjacent display modules 1000 can be very small, even two adjacent display modules adjoin with each other (the spacing is zero).

Figure 11:
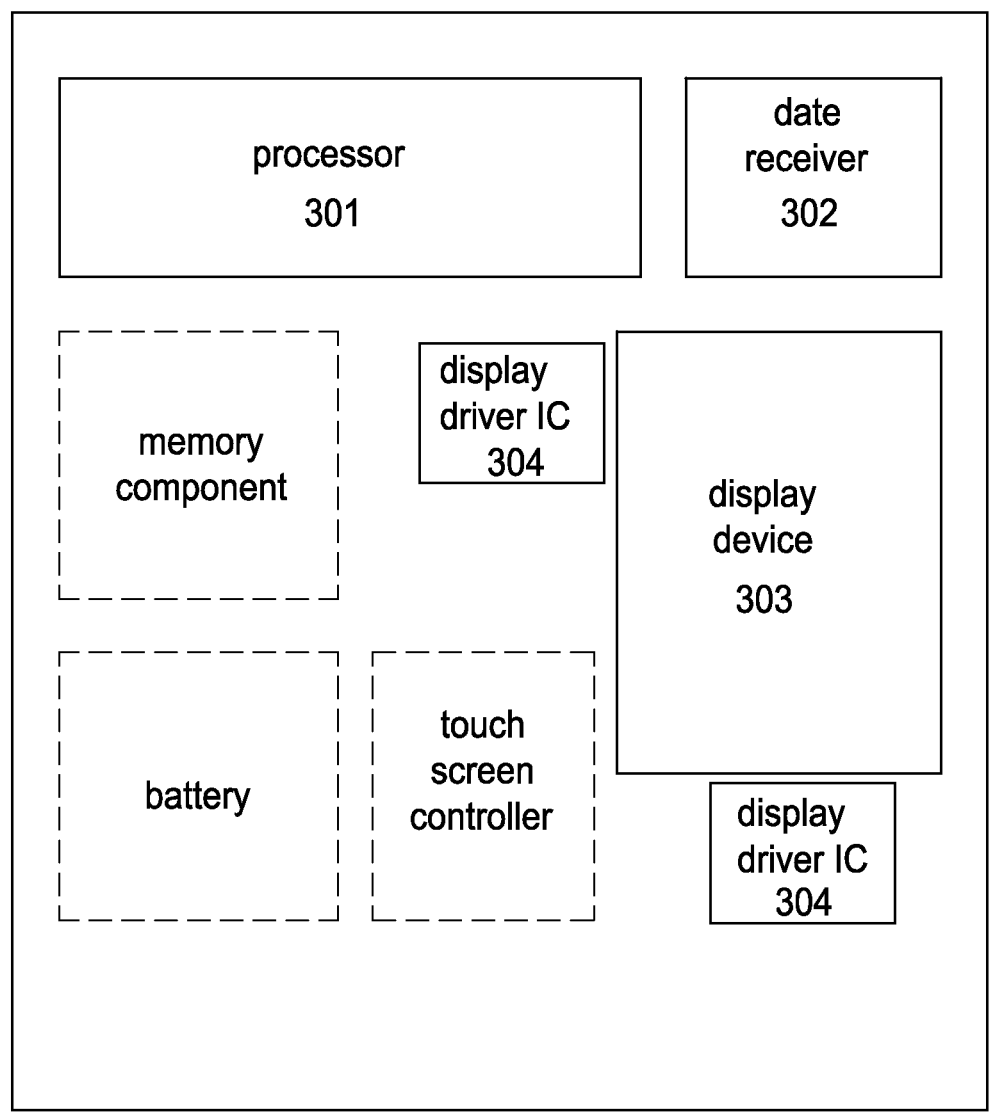
FIG. 11 shows a display system in accordance with an embodiment of the present disclosure.

FIG. 11 is a display system 3000 in accordance with an embodiment of the present disclosure. The display system 3000 includes a processor 301, a data receiver 302, a display device 303, and one or more display driver ICs 304. The data receiver 302 can receive data by the wireless communication or by the wired communication. The method of the wireless communication can adopt any wireless standard or protocol, for example: WiFi (IEEE802.11), WiMAX (IEEE 802.16), IEEE 802.20, LTE, Ev_DO, HSPA+, HSDPA+, HSUPA+, EDGE, GSM, GPRS, CDMA, TDMA, EDCT, Bluetooth, or any wireless protocol designated as 3G, 4G, 5G and higher generation. One or more display driver ICs 304 are electrically coupled to display device 303. The display device 303 includes aforementioned display device 2000, the display module 1000, or the light-emitting devices 100~600. Depending on the application, display system 3000 can optionally include other components, such as memory components, touch screen controllers, sensors, and batteries.

Figure 12A:
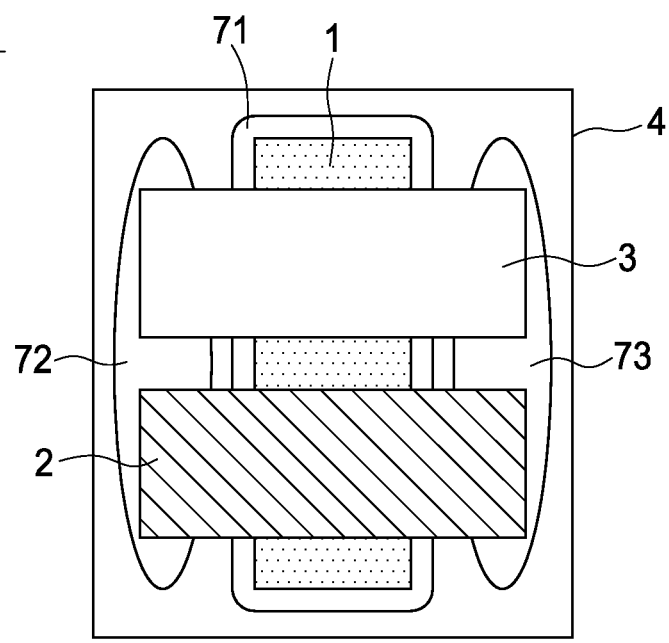
FIG. 12A shows a top view of a light-emitting device in accordance with an embodiment of the present disclosure.

FIG. 12A shows a top view of the light-emitting device 601. The light-emitting device 601 is similar to the light-emitting device 600 of FIG. 6 and includes a first light-emitting unit 1, a second light-emitting unit 2, and a third light-emitting unit 3. The light-emitting surfaces of the light-emitting units 1, 2, and 3 have the same normal direction, and towards the direction corresponding to the supporting body 4. The electrode pads of the light-emitting units 1, 2, and 3 are located at two opposite ends of the bottom surface corresponding to the light-emitting surface, and are electrically connected to the supporting body 4 by flip bonding. The second light-emitting unit 2 is physically separated from the third light-emitting unit 3. The second light-emitting unit 2 and the third light-emitting unit 3 are arranged along a horizontal direction on the light-emitting unit 1 and cover a portion of the first light-emitting unit 1. The longitudinal direction of the second light-emitting unit 2 is perpendicular to the longitudinal direction of the first light-emitting unit 1, and partially overlaps the first light-emitting unit 1. The longitudinal direction of the third light-emitting unit 3 is perpendicular to the longitudinal direction of the first light-emitting unit 1, and partially overlaps the first light-emitting unit 1. The first light-emitting unit 1 is bonded to the supporting body 4 by a paste 71. The electrode pads of the second light-emitting unit 2 and the third light-emitting unit 3 located on the left side of the first light-emitting unit 1 are bonded to the supporting body 4 by a single, non-separating paste 72. The electrode pads of the second light-emitting unit 2 and the third light-emitting unit 3 located on the right side of the first light-emitting unit 1 are bonded to the supporting body 4 by a bulk, non-separated paste 73. The materials of the pastes 71, 72, and 73 and forming methods of can be referred to the aforementioned related descriptions of FIGS. 7 and 8. Each of the lengths of the light-emitting units 1, 2, 3 is larger than 100 μm, each of the widths of the light-emitting units 1, 2, 3 is larger than 50 μm, or each of the sizes (projected area of the active stack) of the light-emitting units 1, 2, 3 is larger than 0.005 mm$^2$. The first light-emitting unit 1 emits a red light, the second light-emitting unit 2 emits a blue light, and the third light-emitting unit 3 emits a green light. In an embodiment, the light emitted from the first light-emitting unit 1 can penetrate the second light-emitting unit 2 and the third light-emitting unit 3, and the area of the first light-emitting unit 1 is larger than that of the third light-emitting unit 3 and larger than that of the second light-emitting units 2. In another embodiment, the second light-emitting unit and the third light-emitting unit include a reflective layer, so that the light emitted from the light-emitting layer of the light-emitting units is reflected by the reflective layer and is emitted upward to increase the brightness. Therefore, the light emitted from the first light-emitting unit 1 does not penetrate the second light-emitting unit 2 and the third light-emitting unit 3. In order to facilitate the stacking of the second light-emitting unit 2 and the third light-emitting unit 3 on the first light-emitting unit 1, the first light-emitting unit 1 does not have a growth substrate or has a thinned growth substrate, so that the thickness of the first light-emitting unit 1 is thinner than that of the second light-emitting unit 2 and that of the third light-emitting unit 3. In another embodiment, in order to reduce the thickness of the light-emitting device, the light-emitting units 1, 2, and 3 do not have the growth substrate or have a thinned growth substrate.

The light-emitting units 2, 3 and the light-emitting unit 1 are joined by a bonding material, and the bonding material can be referred to aforementioned descriptions of FIG. 6. In another embodiment, there is no bonding material between the light-emitting units 1, 2, and the light-emitting units 1, 3. After the light-emitting units 1, 2, and 3 are disposed on the supporting body 4, a glue material covers the light-emitting units 1, 2, and 3 to protect the light-emitting units 1, 2, and 3. The material of the glue can refer to aforementioned description.

Figure 12B:
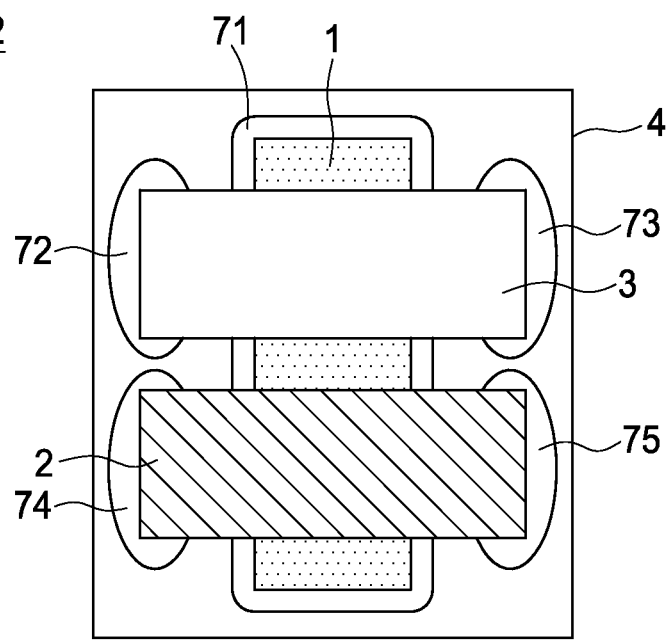
FIG. 12B shows a top view of a light-emitting device in accordance with another embodiment of the present disclosure.

FIG. 12B shows a top view of the light-emitting device 602. The light-emitting device 602 includes a first light-emitting unit 1, a second light-emitting unit 2, and a third light-emitting unit 3. All of the electrode pads of the light-emitting units 1, 2, and 3 are disposed on the bottom surface corresponding to the light-emitting surface, and are electrically connected to the supporting body 4 by flip bonding. The arrangements of the first light-emitting unit 1, the second light-emitting unit 2, and the third light-emitting unit 3 can be referred to the related descriptions of FIG. 12A. The first light-emitting unit 1 is bonded to the supporting body 4 by a paste 71. Two ends of the second light-emitting unit 2 are bonded to the supporting body 4 by pastes 72, 73. Two ends of the third light-emitting unit 3 are bonded to the supporting body 4 by pastes 74, 75. The light-emitting device 601 has some differences from FIG. 12A, the electrode pads of the second light-emitting unit 2 and the third light-emitting unit 3 located on the left side of the first light-emitting unit 1 are bonded to the supporting body 4 by two physically separated pastes 72, 74. The electrode pads of the second light-emitting unit 2 and the third light-emitting unit 3 located on the right side of the first light-emitting unit 1 are bonded to the supporting body 4 by two physically separated pastes 73 and 75. Each of the lengths of the light-emitting units 1, 2, 3 is larger than 100 μm, each of the widths of the light-emitting units 1, 2, 3 is larger than 50 μm, or each of the sizes (projected area of the active stack) of the light-emitting units 1, 2, 3 is larger than 0.005 mm$^2$. The first light-emitting unit 1 emits a red light, the second light-emitting unit 2 emits a blue light, and the third light-emitting unit 3 emits a green light. In an embodiment, the light emitted from the first light-emitting unit 1 can penetrate the second light-emitting unit 2 and the third light-emitting unit 3. The area of the first light-emitting unit 1 is larger than that of the third light-emitting unit 3 and larger than that of the second light-emitting units 2. In another embodiment, the light emitted from the first light-emitting unit 1 does not penetrate the second light-emitting unit 2 and the third light-emitting unit 3.

Figure 12C:
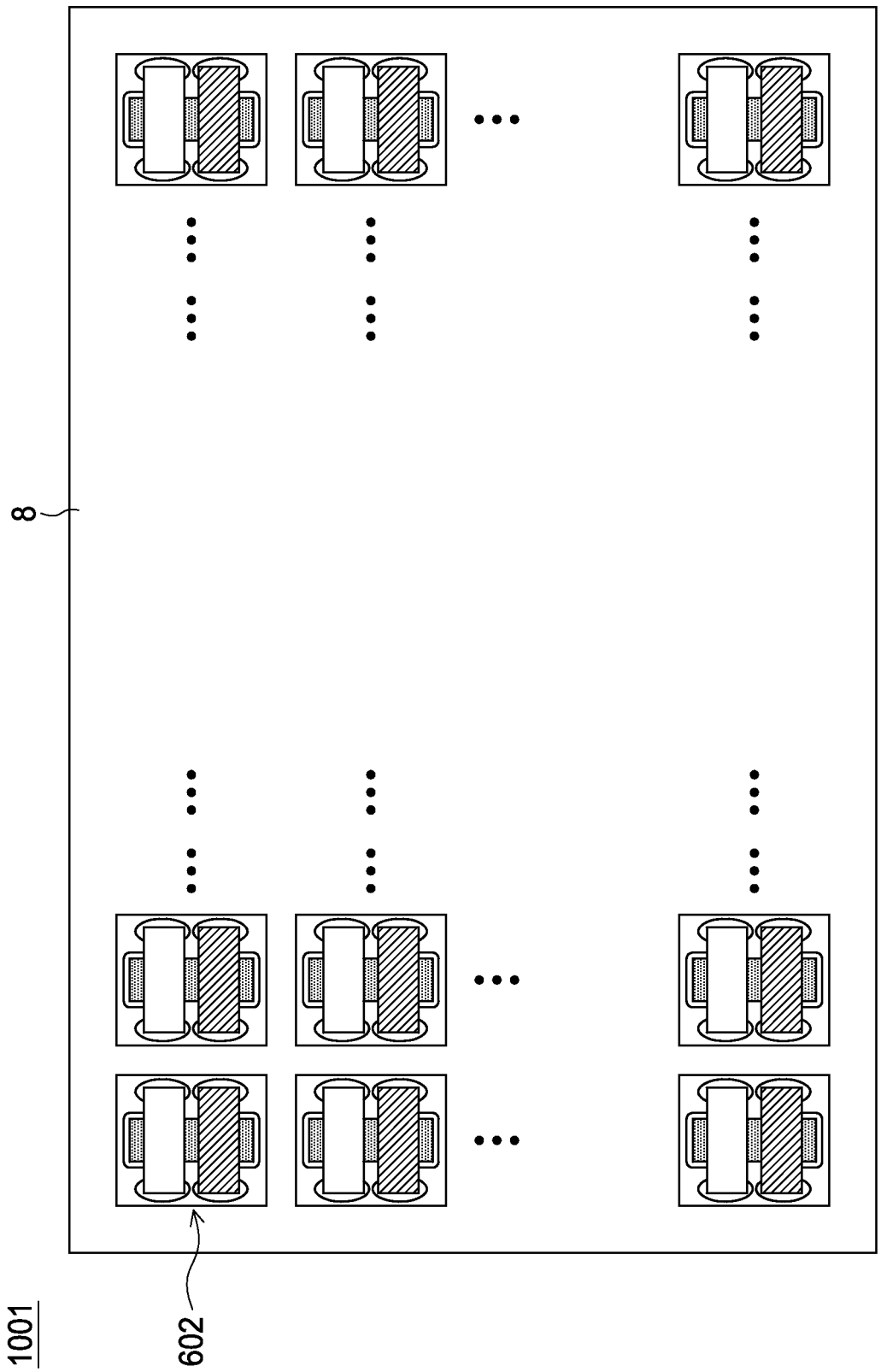
FIG. 12C shows a display module in accordance with an embodiment of the present disclosure.

FIG. 12C shows a display module 1001. The display module 1001 includes a substrate 8, such as a circuit substrate, and a plurality of light-emitting devices, such as the light-emitting device 602. The plurality of light-emitting devices 602 is arranged in an array on the substrate 8 and electrically connected to a circuit on the substrate 8. Each of the light-emitting devices 602 includes a first light-emitting unit which can emit a red light, the second light-emitting unit which can emit a blue light, and the third light-emitting unit which can emit a green light. Therefore each of the light-emitting devices 602 can be regarded as one pixel. The longitudinal direction of the first light-emitting unit 1 is perpendicular to the longitudinal direction of the second light-emitting unit 2, and perpendicular to the longitudinal direction of the third light-emitting unit 3. The longitudinal direction of the second light-emitting unit 2 is parallel to the longitudinal direction of the third light-emitting unit 3. The arrangement direction of the longitudinal sides of each of the first light-emitting unit of the light-emitting devices 602 is horizontal direction (the first direction). The arrangement direction of each of the longitudinal sides of the second light-emitting unit of the light-emitting devices 602 is vertical direction (the second direction). The arrangement direction of each of the longitudinal sides of the third light-emitting unit of the light-emitting devices 602 is vertical direction (the second direction). The second direction is perpendicular to the first direction. The arrangement direction of the longitudinal sides of each of the second light-emitting units is same as that of each of the third light-emitting units. The surface of the substrate 8 has a light-absorbing layer (not shown) to improve the contrast of the display module 1000 when displaying images. The material of the light-absorbing layer can refer to the related descriptions of FIG. 9. In another embodiment, the light-emitting device can be the light-emitting device 601.

Figure 13:
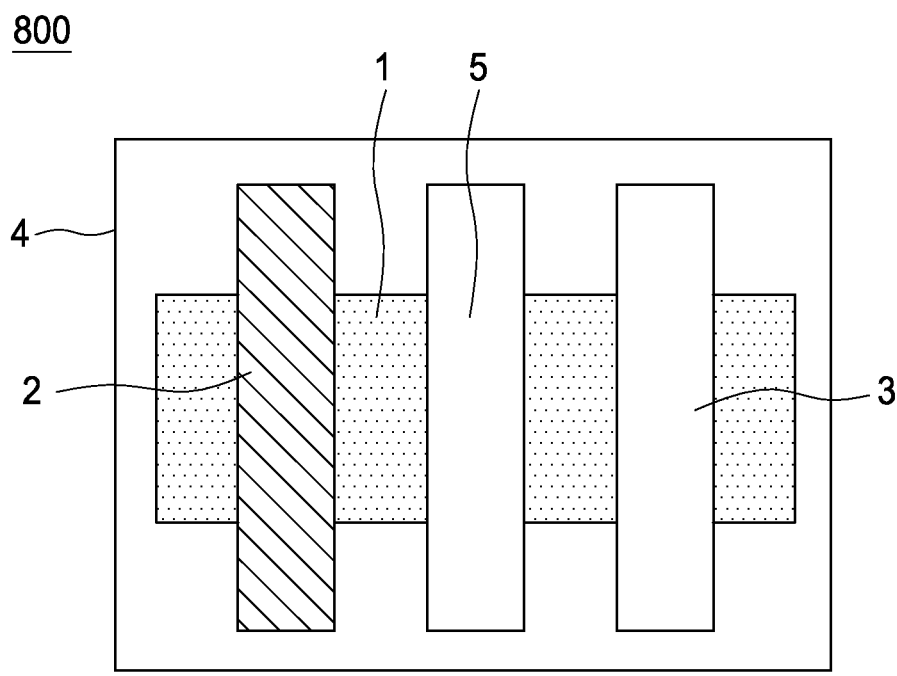
FIG. 13 shows a top view of a light-emitting device in accordance with an embodiment of the present disclosure.
Figure 14:
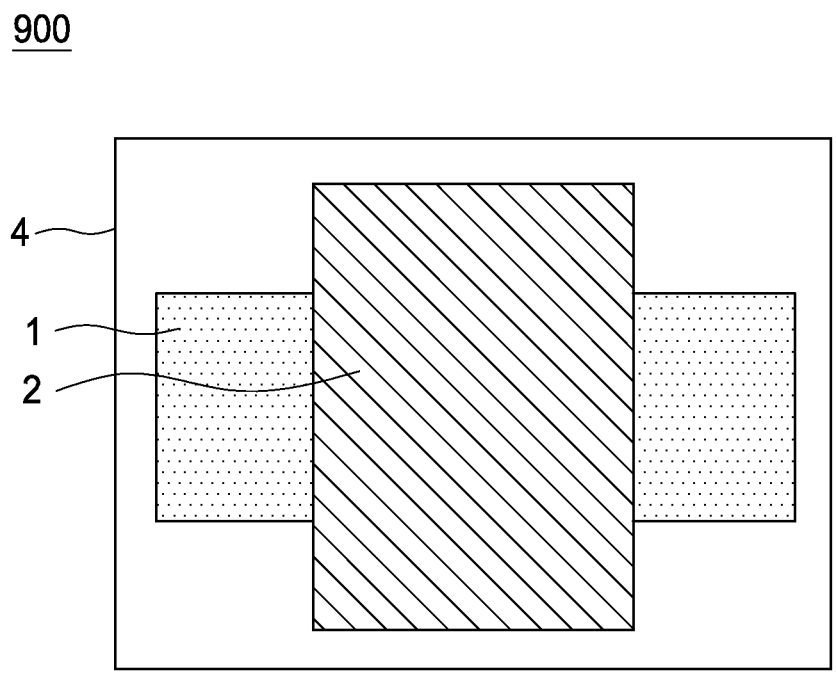
FIG. 14 shows a top view of a light-emitting device in accordance with another embodiment of the present disclosure.

FIG. 5 and FIG. 6 disclose a light-emitting device which includes a plurality of light-emitting units stacked in a single package. Some of the light-emitting units are arranged along a horizontal direction and some of the light-emitting units are arranged along a vertical direction. FIG. 7 explains in detail how to manufacture the light-emitting device of FIG. 6 by a paste containing an insulating material and conductive particles. The above stacking method can also be applied to a light-emitting device with multiple light-emitting wavelength bands. Comparing to a light-emitting device with multiple light-emitting wavelength bands formed by epitaxial growth, the light-emitting device with multiple light-emitting wavelength bands formed in package structure is easier to manufacture and easier to control the light-emitting quality. As shown in FIG. 13, FIG. 13 is a top view of the light-emitting device 800. The light-emitting device 800 can emit a light with multiple light-emitting wavelength bands or with a wide light-emitting wavelength band. The light emitted from light-emitting device 800 depends on the selection and combination of the light-emitting wavelengths of the plurality of light-emitting units. The light-emitting device 800 includes a supporting body 4, and a first light-emitting unit 1, a second light-emitting unit 2, a third light-emitting unit 3, and a fourth light-emitting unit 5 which are arranged on the supporting body 4. The second light-emitting unit 2, the third light-emitting unit 3, and the fourth light-emitting unit 5 are arranged along a horizontal direction on the first light-emitting unit 1, and cover different portions of the light-emitting surface of the first light-emitting unit 1. The light-emitting surfaces of the light-emitting units 1, 2, 3, and 5 have the same normal direction. In a top view, the second light-emitting unit 2, the third light-emitting unit 3, and the fourth light-emitting unit 5 are physically separated from each other. The second light-emitting unit 2 is partially overlapped the first light-emitting unit 1, the third light-emitting unit 3 is partially overlapped the first light-emitting unit 1, the fourth light-emitting unit 5 is partially overlapped the first light-emitting unit 1. The first light-emitting unit 1 has a plurality of light-emitting areas separated by the light-emitting units 2, 3, 5 and not be covered. In an embodiment, the light-emitting units 2, 3, 5 are separated from each other and located between the leftmost side and the rightmost side of the first light-emitting unit 1. Hence, the first light-emitting unit 1 has four light-emitting areas which are separated from each other and not covered. In another embodiment, some of the light-emitting units 2, 3, 5 located at the leftmost or rightmost side of the first light-emitting unit 1, therefore, the first light-emitting unit 1 has at least one uncovered light-emitting area. For example, the second light-emitting unit 2 is located at the leftmost side of the first light-emitting unit 1, and the third light-emitting unit 3 is located at the rightmost side of the first light-emitting unit 1. The fourth light-emitting unit 5 is physically separated from the second light-emitting unit 2 and the third light-emitting unit 3, and is located between the leftmost side and the rightmost side of the first light-emitting unit 1. Hence, and the first light-emitting unit 1 has two separated, uncovered light-emitting areas. In another embodiment, some of the light-emitting units 2, 3, 5 can be arranged side by side and arranged along a horizontal direction on the first light-emitting unit 1, so that the first light-emitting unit 1 has at least one uncovered light-emitting area. For example, the light-emitting units 2, 3, 5 are located between the leftmost side and the rightmost side of the first light-emitting unit 1, the second light-emitting unit 2 and the third light-emitting unit 3 are arranged side by side without gaps and arranged along a horizontal direction. The fourth light-emitting unit 5 is physically separated from the second light-emitting unit 2 and the third light-emitting unit 3. Hence, the first light-emitting unit 1 has three separated, uncovered light-emitting areas.

In order to facilitate the stacking of the second light-emitting units 2, 3, 5 on the first light-emitting unit 1, the first light-emitting unit 1 does not have a growth substrate or has a thinned growth substrate, so that the thickness of the first light-emitting unit 1 is thinner than those of the light-emitting units 2, 3, 5. In another embodiment, in order to reduce the thickness of the light-emitting device, the light-emitting units 1, 2, 3, 5 do not have the growth substrate or have a thinned growth substrate. The light-emitting units 2, 3, 5 and the light-emitting unit 1 are joined by a bonding material, and the bonding material can include glue. The glue can comprise polyimide, benzocyclobutene (BCB), perfluorocyclobutane (PFCB), epoxy, Su8, or spin-on glass (SOG). In another embodiment, there is no bonding material between the light-emitting units 1, 2, between the light-emitting units 1, 3, and between the light-emitting units 1, 5. After the light-emitting units 1, 2, 3, 5 are disposed on the supporting body 4, a glue material covers the light-emitting units 1, 2, 3, 5 to protect the light-emitting units 1, 2, 3, 5. The material of the glue can refer to aforementioned description.

The light-emitting units 1, 2, 3, 5 can be electrically connected to an external power source by flip bonding. Like FIG. 6, the second light-emitting unit 2 includes a portion overlapping the first light-emitting unit 1, and another two portions without overlapping the first light-emitting unit 1 located on opposite sides of the portion overlapping the first light-emitting unit 1. The third light-emitting unit 3 includes a portion overlapping the first light-emitting unit 1, and another two portions without overlapping the first light-emitting unit 1 located on opposite sides of the portion overlapping the first light-emitting unit 1. The fourth light-emitting unit 5 includes a portion overlapping the first light-emitting unit 1, and another two portions without overlapping the first light-emitting unit 1 located on opposite sides of the portion overlapping the first light-emitting unit 1. All of the electrode pads of the light-emitting units 1, 2, 3, 5 are disposed on the bottom surface corresponding to the light-emitting surface, and are electrically connected to the supporting body 4 by flip bonding. The materials and bonding steps of the electrode pads and the supporting body 4 can refer to the related descriptions of FIG. 7 and FIG. 8.

The light-emitting device 800 can emit a light with a wavelength band from red light to infrared light. For example, the first light-emitting unit 1 can emit a red light having a wavelength of 630 to 780 nm, and the light-emitting units 2, 3, and 5 can emit an infrared light having a wavelength larger than 780 nm, for example, 810 nm, 850 nm, 880 nm, 910 nm, 940 nm, 970 nm, or 1050 nm. In another embodiment, some of the light-emitting units 1, 2, 3, 5 can simultaneously emit two lights with two wavelengths, for example, the first light-emitting unit 1 can emit a light with a wavelength less than 720 nm, the second light-emitting unit 2 can emit an infrared light with two wavelengths of 810 nm and 850 nm, the third light-emitting unit 3 can emit an infrared light with two wavelengths of 880 nm and 910 nm, and the fourth light-emitting unit 5 can emit an infrared light with a wavelength larger than 1000 nm. The light emitted from the first light-emitting unit 1 can penetrate at least one of the second light-emitting unit 2, the third light-emitting unit 3, and the fourth light-emitting unit 5, and the light emitted from the first light-emitting unit 1 cannot penetrate at least one of the second light-emitting unit 2, the third light-emitting unit 3, and the fourth light-emitting unit 5. The shape of the light-emitting unit can be a rectangle, a circle, a triangle, a square, a parallelogram, a trapezoid, or other polygonal shapes. The shape of the light-emitting unit is an exemplary here and is not a limitation of the disclosure. In an embodiment, each of the light-emitting units has a rectangular shape. In another embodiment, the shape of each of the light-emitting units can be same, different, or some can be the same and some are different. The number of light-emitting units is four which is exemplary here and is not a limitation of the invention. In another embodiment, the number of light-emitting units is at least greater than two. The light-emitting wavelength of the light-emitting unit is an exemplary here and is not a limitation of the disclosure. In another embodiment, some or all of the light-emitting units emit the lights that are different from red or infrared light.

In order to facilitate the stacking of the second light-emitting unit 2 on the first light-emitting unit 1, the first light-emitting unit 1 does not have a growth substrate or has a thinned growth substrate, so that the thickness of the first light-emitting unit 1 is thinner than those of the light-emitting unit 2. In another embodiment, in order to reduce the thickness of the light-emitting device, the light-emitting units 1, 2 do not have the growth substrate or have a thinned growth substrate. The light-emitting units 2 and the light-emitting unit 1 are joined by a bonding material, and the bonding material can include glue. The glue can comprise polyimide, benzocyclobutene (BCB), perfluorocyclobutane (PFCB), epoxy, Su8, or spin-on glass (SOG). In another embodiment, there is no bonding material between the light-emitting units 1, 2. After the light-emitting units 1, 2 are disposed on the supporting body 4, a glue material covers the light-emitting units 1, 2 to protect the light-emitting units 1, 2. The material of the glue can refer to aforementioned description. The light emitted from the first light-emitting unit 1 penetrates the second light-emitting unit 2. Therefore, the lights emitted from the first light-emitting unit 1 and the second light-emitting unit 2 are coaxial, and the light-emitting device 900 is a light-emitting device which can emit coaxial light.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A display module, comprising:
a substrate comprising a top surface;
a plurality of light-emitting devices arranged in an array configuration on the top surface, each light-emitting device comprising:
a first light-emitting area comprising a first semiconductor light-emitting unit configured to emit a red light;
a second light-emitting area comprising a second semiconductor light-emitting unit configured to emit a blue light; and a third light-emitting area comprising a third semiconductor light-emitting unit configured to emit a green light, wherein the first light-emitting area is larger than the second light-emitting area and larger than the third light-emitting area, wherein the first semiconductor light-emitting unit is overlapped with the second semiconductor light-emitting unit or the third semiconductor light-emitting unit in a normal direction of the top surface, and the second semiconductor light-emitting unit and the third semiconductor light-emitting unit do not overlap with each other in the normal direction of the top surface, wherein each of the first semiconductor light-emitting unit, the second semiconductor light-emitting unit, and the third semiconductor light-emitting unit has a width of less than 100 μm, and a length of less than 100 μm.

2. The display module according to claim 1, further comprising a supporting body, wherein the first semiconductor light-emitting unit, the second semiconductor light-emitting unit, and the third semiconductor light-emitting unit are disposed on the supporting body.

3. The display module according to claim 1, wherein the first semiconductor light-emitting unit, the second semiconductor light-emitting unit, and the third semiconductor light-emitting unit are flip chips.

4. The display module according to claim 1, wherein the first light-emitting area is at least 1.5 times of the second light-emitting area.

5. The display module according to claim 4, wherein the first light-emitting area is at least 1.5 times of the third light-emitting area.

6. The display module according to claim 1, wherein the first semiconductor light-emitting unit does not have a growth substrate or has a thinned growth substrate.

7. The display module according to claim 1, wherein the second semiconductor light-emitting unit and the third semiconductor light-emitting unit are disposed on the first semiconductor light-emitting unit.

8. The display module according to claim 1, further comprising a glue continuously covering the first semiconductor light-emitting unit, the second semiconductor light-emitting unit, and the third semiconductor light-emitting unit.

9. The display module according to claim 2, further comprising a paste disposed between the first semiconductor light-emitting unit and the supporting body, wherein the paste comprises an insulating material and a conductive structure surrounded by the insulating material.

10. The display module according to claim 9, wherein the conductive structure comprises an outer side surface, which has a necking shape.

11. The display module according to claim 9, wherein the insulating material comprises an outermost surface, the outermost surface has an angle with respect to the supporting body, and the angle increases along a direction from the supporting body toward the first semiconductor light-emitting unit.

12. The display module according to claim 9, wherein the supporting body comprises a bonding pad, the first semiconductor light-emitting unit comprises an electrode pad facing to the bonding pad, the conductive structure is connected to the bonding pad and the electrode pad, and the conductive structure comprises a minimum width smaller than widths of the bonding pad and the electrode pad.

13. The display module according to claim 9, further comprising another paste which is connected to the second and third semiconductor light-emitting units.

14. The display module according to claim 1, wherein the first semiconductor light-emitting unit has at least two separated portions which are not covered by the second semiconductor light-emitting unit and the third semiconductor light-emitting unit.

15. The display module according to claim 1, wherein the first semiconductor light-emitting unit has a longitudinal side perpendicular to that of the second semiconductor light-emitting unit.

16. The display module according to claim 1, wherein the first semiconductor light-emitting unit has a geometric center not aligned with that of the second semiconductor light-emitting unit in the normal direction of the top surface.

17. The display module according to claim 1, wherein the first semiconductor light-emitting unit has a geometric center overlapped with that of the second semiconductor light-emitting unit in the normal direction of the top surface.

18. The display module according to claim 1, wherein the first semiconductor light-emitting unit is electrically connected to an external power source in a flip bonding configuration, and the second semiconductor light-emitting unit is electrically connected to the external power source by wire bonding.

19. The display module according to claim 1, wherein at least two of the first, second and third semiconductor light-emitting units have different shapes.

20. The display module according to claim 1, wherein the second semiconductor light-emitting unit or the third semiconductor light-emitting unit is bonded to the first semiconductor light-emitting unit by a glue.

* * * * *